(12) United States Patent
Ryu et al.

(10) Patent No.: US 10,873,337 B2
(45) Date of Patent: Dec. 22, 2020

(54) ELECTRONIC CIRCUIT INCLUDING PIPELINE CONVERTING CIRCUIT

(71) Applicant: KOREA ADVANCED INSTITUTE OF SCIENCE AND TECHNOLOGY, Daejeon (KR)

(72) Inventors: Seung-Tak Ryu, Daejeon (KR); Minjae Seo, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 0 days.

(21) Appl. No.: 16/798,716

(22) Filed: Feb. 24, 2020

(65) Prior Publication Data
US 2020/0274543 A1    Aug. 27, 2020

(30) Foreign Application Priority Data
Feb. 25, 2019 (KR) .................. 10-2019-0021821

(51) Int. Cl.
*H03M 1/00* (2006.01)

(52) U.S. Cl.
CPC .................. *H03M 1/002* (2013.01)

(58) Field of Classification Search
CPC ........ H03M 1/002; H03M 1/164; H03M 1/46; H03M 1/12; H03M 1/165
(Continued)

(56) References Cited

U.S. PATENT DOCUMENTS 6,857,002 B1 * 2/2005 Thomsen ........... H03H 17/0294
708/168

8,896,475 B2 * 11/2014 Shibata ................. H03M 1/124
341/161
(Continued)

FOREIGN PATENT DOCUMENTS

| KR | 20110108562 A | 10/2011 |
|----|---------------|---------|
| KR | 20140000365 A | 1/2014 |
| KR | 20140063059 A | 5/2014 |
| KR | 101774522 B1 | 9/2017 |
| KR | 20190143515 A | 12/2019 |

OTHER PUBLICATIONS

Bob Verbruggen et al., "A 1.7mW 11b 250MS/s 2• Interleaved Fully Dynamic Pipelined SAR ADC in 40nm Digital CMOS" IEEE International Solid-sTate Circuits conference, Feb. 22, 2012.
(Continued)

*Primary Examiner* — Lam T Mai
(74) *Attorney, Agent, or Firm* — Harness, Dickey & Pierce, P.L.C.

(57) ABSTRACT

An electronic circuit includes a first converting circuit, an amplifying circuit, and a second converting circuit. The first converting circuit outputs a first residual voltage associated with converting an analog signal into a first digital signal and a second residual voltage generated based on the first residual voltage. The amplifying circuit generates a third residual voltage by amplifying the first residual voltage through an amplifying path during a first time duration and generates a fourth residual voltage by amplifying the second residual voltage through the amplifying path during a second time duration after the first time duration. The second converting circuit generates a second digital signal associated with the analog signal by performing an interpolation operation based on the third residual voltage and the fourth residual voltage.

20 Claims, 14 Drawing Sheets

(58) Field of Classification Search
USPC .......................................... 341/155, 161, 162
See application file for complete search history.

(56) References Cited

U.S. PATENT DOCUMENTS

| | | | |
|---|---|---|---|
| 9,356,616 B1 | 5/2016 | Pan et al. | |
| 9,735,794 B1 * | 8/2017 | Paul ...................... | H03M 1/002 |
| 9,847,790 B2 * | 12/2017 | Liu ........................ | H03M 1/38 |
| 9,998,131 B1 * | 6/2018 | Kinyua ............... | H03F 3/45237 |
| 10,033,395 B1 * | 7/2018 | Vaz ....................... | H03M 1/001 |
| 10,284,145 B2 | 5/2019 | Sun et al. | |
| 2006/0114141 A1 * | 6/2006 | Nandi ................... | H03M 1/167 |
| | | | 341/155 |
| 2010/0176977 A1 * | 7/2010 | Ranganathan ........ | H03M 1/002 |
| | | | 341/122 |
| 2013/0321189 A1 * | 12/2013 | Yoshioka .............. | H03M 1/145 |
| | | | 341/156 |
| 2015/0256189 A1 * | 9/2015 | Marie ................... | H03M 1/002 |
| | | | 341/118 |
| 2018/0309408 A1 | 10/2018 | Sun et al. | |
| 2019/0089365 A1 * | 3/2019 | Yoshioka .............. | H03M 1/002 |

OTHER PUBLICATIONS

Chris Mangelsdorg, et al., "WP 4.4: A two-Residue Architecture for Multistage ADC%", 1993 IEEE International Solid-state Circuits Conference, pp. 64-65, 1993.

Jan Mulder, et al., "An 800MS/s Dual-Residue Pipeline ADC in 40nm CMOS", 2011 IEEE International Solid-State Circuits Conference, pp. 184-186, 2011.

Masaya Miyahara, et al., "A 10b 320 MS/s 40mW Open-Loop Interpoloated Pipeline ADC", 2011 Symposium on VLSI Circuits Digest of Technical Papers, pp. 126-127, 2011.

Kyoung-Jun Moon, et al., "A 9.1 ENOB 21.7fJ/conversion-step 10b 500MS/s Single-channel Pipelined SAR ADC with a Current-mode Fine ADC in 28nm CMOS", 2017 Symposium on VLSI Circuits Digest of Technical Papers, 2017.

Jae-Won Nam, et al., "A 12-bit 1.6 GS/s Interleaved SAR ADC with Dual Reference Shifting and Interpolation Achieving 17.8fJ/conv-step in 65nm CMOS", 2016 Symposium on VLSI Circuits Digest of Technical Papers, 2016.

* cited by examiner

ELECTRONIC CIRCUIT INCLUDING PIPELINE CONVERTING CIRCUIT

CROSS-REFERENCE TO RELATED APPLICATIONS

This application claims priority under 35 U.S.C. § 119 to Korean Patent Application No. 10-2019-0021821 filed on Feb. 25, 2019, in the Korean Intellectual Property Office, the disclosures of which are incorporated by reference herein in their entireties.

BACKGROUND

Embodiments of the present disclosure described herein relate to an electronic circuit, and more particularly, relate to an electronic circuit configured to convert a signal.

A mobile device such as a smartphone or a tablet personal computer (PC) is designed to have a small size for portability. Mobile devices include semiconductor devices of a small size. The mobile device uses a power supply device, which is capable of storing only a limited power, such as a battery. Accordingly, a design of an electronic circuit that is placed in the small area and reduces power consumption is required to design the mobile device.

Most mobile devices are configured to process information by using a digital signal. Accordingly, an analog-to-digital converter (ADC) is one of essential components included in the mobile devices. With an increasing demand on a high-performance mobile device, a high-resolution ADC is being developed.

In the case where the high-resolution ADC is implemented through the design of high complexity, the implemented ADC may be placed in the wide area and may consume a lot of power. Accordingly, an ADC capable of being implemented through the design of low complexity is required to use the high-resolution ADC in the mobile device.

SUMMARY

The present disclosure may provide an electronic circuit designed with low complexity. Embodiments may provide an electronic circuit configured to amplify residual voltages through one amplification path and to perform an interpolation operation based on the amplified residual voltages.

According to an exemplary embodiment, an electronic circuit may include a first converting circuit, an amplifying circuit, and a second converting circuit. The first converting circuit may output a first residual voltage associated with converting an analog signal into a first digital signal and a second residual voltage generated based on the first residual voltage. The amplifying circuit may generate a third residual voltage by amplifying the first residual voltage through an amplifying path during a first time duration and may generate a fourth residual voltage by amplifying the second residual voltage through the amplifying path during a second time duration after the first time duration. The second converting circuit may generate a second digital signal associated with the analog signal by performing an interpolation operation based on the third residual voltage and the fourth residual voltage.

BRIEF DESCRIPTION OF THE FIGURES

The above and other objects and features of the present disclosure will become apparent by describing in detail exemplary embodiments thereof with reference to the accompanying drawings.

DETAILED DESCRIPTION

Hereinafter, embodiments of the present disclosure are described in detail with reference to the accompanying drawings. In the following description, specific details such as detailed components and structures are merely provided to assist the overall understanding of the embodiments of the present disclosure. Therefore, it should be apparent to those skilled in the art that various changes and modifications of the embodiments described herein may be made without departing from the scope and spirit of the present invention. In addition, descriptions of well-known functions and structures are omitted for clarity and conciseness. The terms described below are terms defined in consideration of functions of the present disclosure and are not limited to a specific function. The definitions of the terms should be determined based on the contents throughout the specification.

In the following drawings or in the detailed description, circuits may be connected with any other components in addition to components illustrated in drawings or disclosed in the detailed description. Connections between circuits or components may be direct or indirect. Circuits or components may be connected through respective communication or may be physically connected.

Unless otherwise defined, all terms used herein, which include technical terminologies or scientific terminologies, have the same meaning as that understood by a person skilled in the art to which the present invention belongs. Terms defined in a generally used dictionary are to be interpreted to have meanings equal to the contextual meanings in a relevant technical field, and are not interpreted to have ideal or excessively formal meanings unless clearly defined in the specification. For better understanding, in the detailed description, a level of a specific voltage may be expressed by using a sign indicating the voltage. For example, a level of a voltage Vp is expressed by "Vp".

Figure 1:
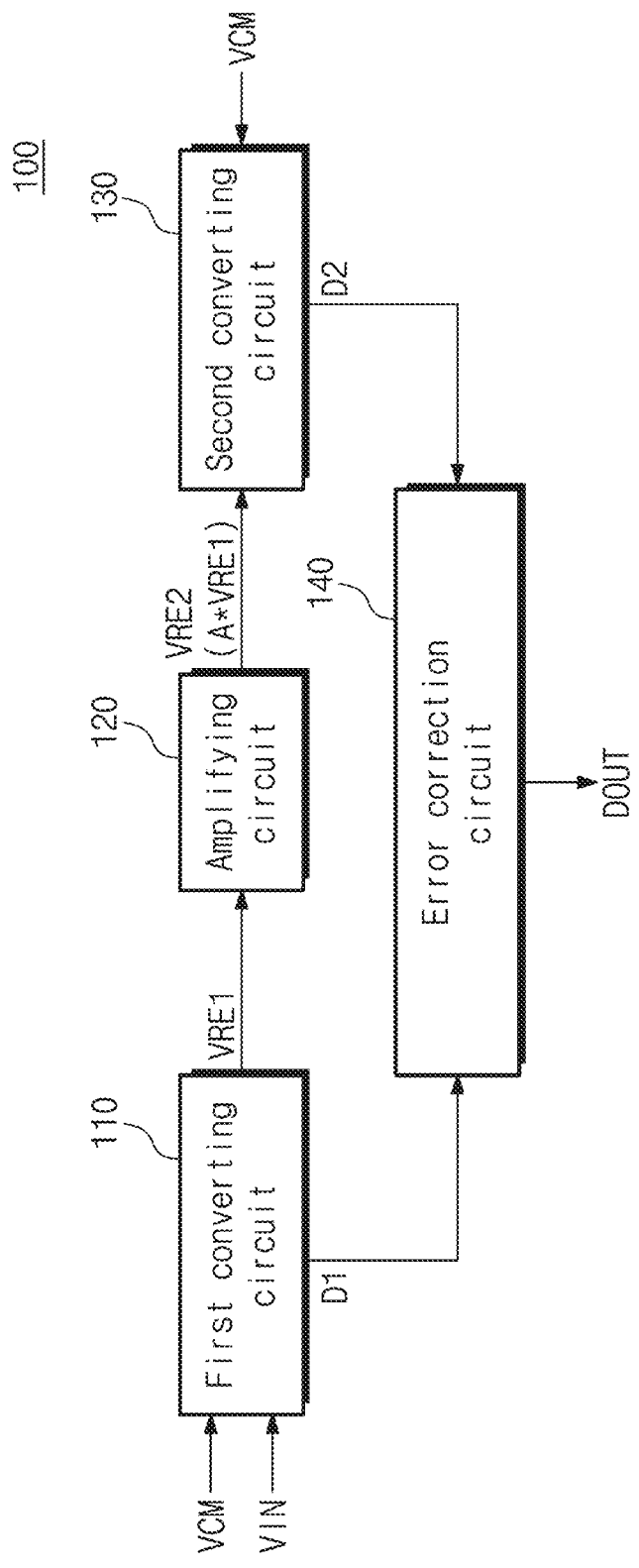
FIG. 1 is a block diagram illustrating an electronic circuit according to an embodiment of the present disclosure.

FIG. 1 is a block diagram illustrating an electronic circuit according to an embodiment of the present disclosure.

Referring to FIG. 1, an electronic circuit 100 may include a first converting circuit 110, an amplifying circuit 120, a second converting circuit 130, and an error correction circuit 140.

The electronic circuit 100 may be a component of an electronic device. For example, the electronic device may be one of a personal computer (PC), a workstation, a notebook computer, a mobile device, etc. For example, the electronic circuit 100 may include a component, which converts analog signals received by the electronic device into digital signals, such as an analog-to-digital converter (e.g., a pipeline ADC). The electronic device may further include various types of electronic circuits configured to process an analog signal and a digital signal. An exemplary configuration of an electronic device including the electronic circuit 100 will be more fully described with reference to FIG. 14.

The first converting circuit 110 may receive a signal VIN from any other component of the electronic device. Alternatively, the first converting circuit 110 may receive the signal VIN from any other electronic device or a system outside the electronic device. The signal VIN may be an analog signal including various kinds of information (e.g., information about an image and information about a voice).

The first converting circuit 110 may receive a common mode voltage VCM. For example, the first converting circuit 110 may receive the common mode voltage VCM from an electronic device such as a voltage generator. The common mode voltage VCM may be a voltage having a level to be used to decide a logical value corresponding to the signal VIN, that is, a reference level. The common mode voltage VCM will be more fully described with reference to FIG. 3.

The first converting circuit 110 may convert the signal VIN and may generate a digital signal D1. The first converting circuit 110 may include various forms of electronic circuits for converting the signal VIN into the digital signal D1. For example, the first converting circuit 110 may include electronic circuits configured to implement operations of a successive approximation register ADC (SAR ADC).

The digital signal D1 that is generated based on the signal VIN may indicate data associated with information included in the signal VIN. For example, the digital signal D1 may indicate data that are expressed by "n" bits for transferring image information and voice information included in the signal VIN (n being a natural number). The first converting circuit 110 may output the digital signal D1 to the error correction circuit 140.

A voltage VRE1 may be generated in the procedure in which the first converting circuit 110 converts the signal VIN. For example, the voltage VRE1 may be a residual voltage that is generated when the signal VIN is converted into the digital signal D1. An example is illustrated in FIG. 1 as the voltage VRE1 is one voltage, but the voltage VRE1 may include one or more voltages. For example, the voltage VRE1 may include one or more residual voltages that are sequentially output from the first converting circuit 110. An exemplary configuration and exemplary operations of the first converting circuit 110 will be described with reference to FIGS. 2 to 6.

The amplifying circuit 120 may receive the voltage VRE1 from the first converting circuit 110. The amplifying circuit 120 may amplify the voltage VRE1 to generate a voltage VRE2. For example, in the case where a gain of the amplifying circuit 120 is "A", a level of the voltage VRE2 may be "A*VRE1". The amplifying circuit 120 may output the voltage VRE2, which is obtained by amplifying the voltage VRE1, to the second converting circuit 130.

The voltage VRE1 may include one or more residual voltages that are sequentially output from the first converting circuit 110. The amplifying circuit 120 may include one amplifying path for amplifying one or more residual voltages received from the first converting circuit 110. In the specification, the "amplifying path" means a path of a current and a voltage, which is formed of various electronic circuits (e.g., various types of amplifying elements and a conductive line) configured to amplify a level of an analog signal. An example is illustrated in FIG. 1 as the voltage VRE2 is one voltage, but the voltage VRE2 may include one or more voltages. For example, the voltage VRE2 may include one or more residual voltages that are amplified and are sequentially output by the amplifying circuit 120.

Because the voltage VRE2 is generated based on the voltage VRE1 and the voltage VRE1 is generated based on the signal VIN, the voltage VRE2 may include all or a part of information included in the signal VIN. For example, the voltage VRE2 may be an analog signal including all or a part of various kinds of information included in the signal VIN.

The second converting circuit 130 may receive the voltage VRE2 from the amplifying circuit 120. For example, the second converting circuit 130 may sequentially receive one or more voltages included in the voltage VRE2. Also, the second converting circuit 130 may receive the common mode voltage VCM. For example, the second converting circuit 130 may receive the common mode voltage VCM from an electronic device such as a voltage generator.

The second converting circuit 130 may convert the voltage VRE2 and may generate a digital signal D2. The digital signal D2 may indicate data corresponding to information included in the voltage VRE2. For example, the digital signal D2 may indicate data that are expressed by "m" bits associated with all or a part of the information included in the signal VIN (m being a natural number). The second converting circuit 130 may output the digital signal D2 to the error correction circuit 140.

The second converting circuit 130 may include various forms of electronic circuits for converting the signal VIN into the digital signal D2. For example, the second converting circuit 130 may include electronic circuits for implementing the SAR ADC performing an interpolation operation. An exemplary configuration and exemplary operations of the second converting circuit 130 will be described with reference to FIGS. 7 to 12.

The error correction circuit 140 may receive the digital signal D1 from the first converting circuit 110 and may receive the digital signal D2 from the second converting circuit 130. The error correction circuit 140 may generate a digital signal DOUT based on the digital signals D1 and D2.

To output the digital signal DOUT, the error correction circuit 140 may perform various types of error correction based on the digital signals D1 and D2. For example, the error correction circuit 140 may perform error correction on the digital signal D2 based on the digital signal D1. Afterwards, the error correction circuit 140 may generate the digital signal DOUT including on the digital signal D1 and the corrected digital signal D2.

For example, the digital signal D1 may indicate n-bit data, and the digital signal D2 may indicate m-bit data. The error correction circuit 140 may perform error correction on the digital signal D2 by using a least significant bit (LSB) of the digital signal D1. The error correction circuit 140 may generate the digital signal DOUT that includes (m+n−1)-bit data including (n−1)-bit data other than the LSB of the digital signal D1 and the m-bit data of the digital signal D2. An embodiment of error correction that is performed based on the digital signals D1 and D2 is described, but it may be understood that a type of error correction that is performed by the error correction circuit 140 is not limited to the embodiment.

The error correction circuit 140 may output the digital signal DOUT to any other component of the electronic device. Alternatively, the error correction circuit 140 may output the digital signal DOUT to any other electronic device or a system outside the electronic device. The digital signal DOUT may include all or a part of the information included in the signal VIN. Accordingly, any other component of the electronic device, any other electronic device, or a system may obtain the information included in the signal VIN based on the digital signal DOUT.

Figure 2:
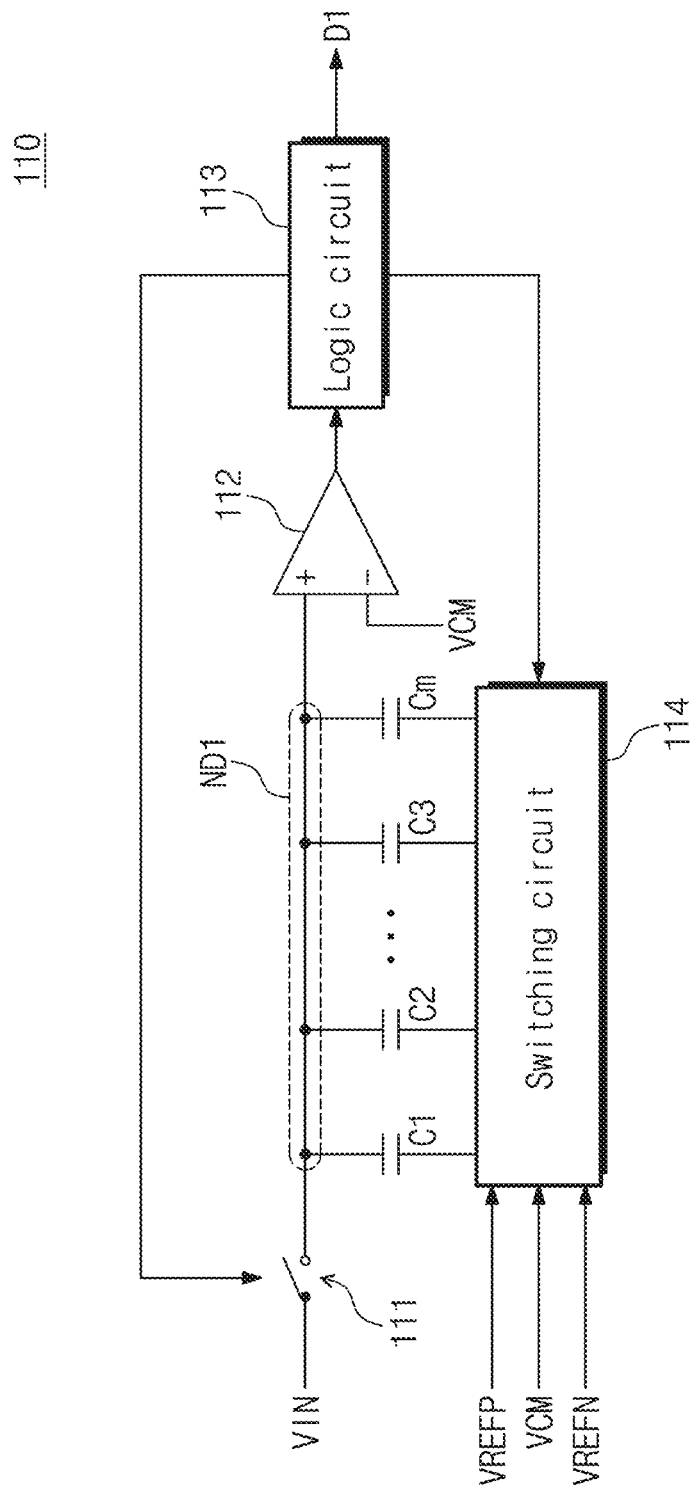
FIG. 2 is a block diagram illustrating an exemplary configuration of a first converting circuit of FIG. 1.

FIG. 2 is a block diagram illustrating an exemplary configuration of a first converting circuit of FIG. 1.

Referring to FIG. 2, the first converting circuit 110 may include a sampler 111, a comparator 112, a logic circuit 113, a switching circuit 114, capacitive elements C1 to C3, and a capacitive element Cm. An example is illustrated in FIG. 2 as the first converting circuit 110 includes three or more capacitive elements C1 to C3 and Cm, but the number of capacitive elements included in the first converting circuit 110 may be variously determined depending on a resolution selected by a designer.

The sampler 111 may sample the signal VIN based on a signal (e.g., a clock signal) of a specific frequency, which is output from the logic circuit 113. The sampler 111 may sample the signal VIN and may provide a voltage corresponding to a level of an analog signal to a node ND1. The sampler 111 of FIG. 2 is illustrated in the form of a switch element, and this is provided for better understanding. It may be well understood that the sampler 111 is implemented with hardware circuits (e.g., a capacitor and a flip-flop) configured to sample and hold an intended signal level.

The comparator 112 may receive a voltage (hereinafter referred to as a "voltage of the node ND1") formed at the node ND1 through a non-inverting terminal and may receive the common mode voltage VCM through an inverting terminal. The comparator 112 may compare a level of the voltage of the node ND1 and a reference level of the common mode voltage VCM. The comparator 112 may generate a comparison result corresponding to the comparison operation. The comparator 112 may output a signal indicating the comparison result to the logic circuit 113.

When a level of a voltage (i.e., the voltage of the node ND1) received through the non-inverting terminal is equal to or greater than a level of a voltage (i.e., the reference level of the common mode voltage VCM) received through the inverting terminal, the comparator 112 may output the signal indicating a logical value of "1" as the comparison result. In contrast, when the level of the voltage (i.e., the voltage of the node ND1) received through the non-inverting terminal is smaller than the level of the voltage (i.e., the reference level of the common mode voltage VCM) received through the inverting terminal, the comparator 112 may output the signal indicating a logical value of "0" as the comparison result.

The logic circuit 113 may obtain comparison results based on signals sequentially received from the comparator 112. The logic circuit 113 may control the switching circuit 114 based on the obtained comparison results. For example, the logic circuit 113 may control the switching circuit 114 depending on logic for implementing operations of various types of SAR ADCs. Depending on operations of the switching circuit 114 that are performed under control of the logic circuit 113, the capacitive elements C1 to Cm may be charged by a voltage formed at the node ND1.

The logic circuit 113 may collect comparison results that are obtained based on signals received from the comparator 112 and may obtain digital data converted from the signal VIN based on the collected comparison results. The logic circuit 113 may generate the digital signal D1 indicating the obtained digital data. The logic circuit 113 may output the digital signal D1 to the error correction circuit 140 of FIG. 1.

The switching circuit 114 may receive reference voltages VREFP and VREFN and the common mode voltage VCM from an electronic device such as a voltage generator. As will be described with reference to FIGS. 3 to 6, the reference voltage VREFP may have a level corresponding to the logical value of "1", the reference voltage VREFN may have a level corresponding to a logical value of "0", and the common mode voltage VCM may have a reference level to be used to determine a logical value corresponding to the signal VIN.

The switching circuit 114 may operate under control of the logic circuit 113. Under control of the logic circuit 113, the switching circuit 114 may selectively provide one of the reference voltage VREFP or VREFN or the common mode voltage VCM to each of the capacitive elements C1 to C3 and the capacitive element Cm. Exemplary operations of the switching circuit 114 will be more fully described with reference to FIGS. 3 to 6.

Figure 3:
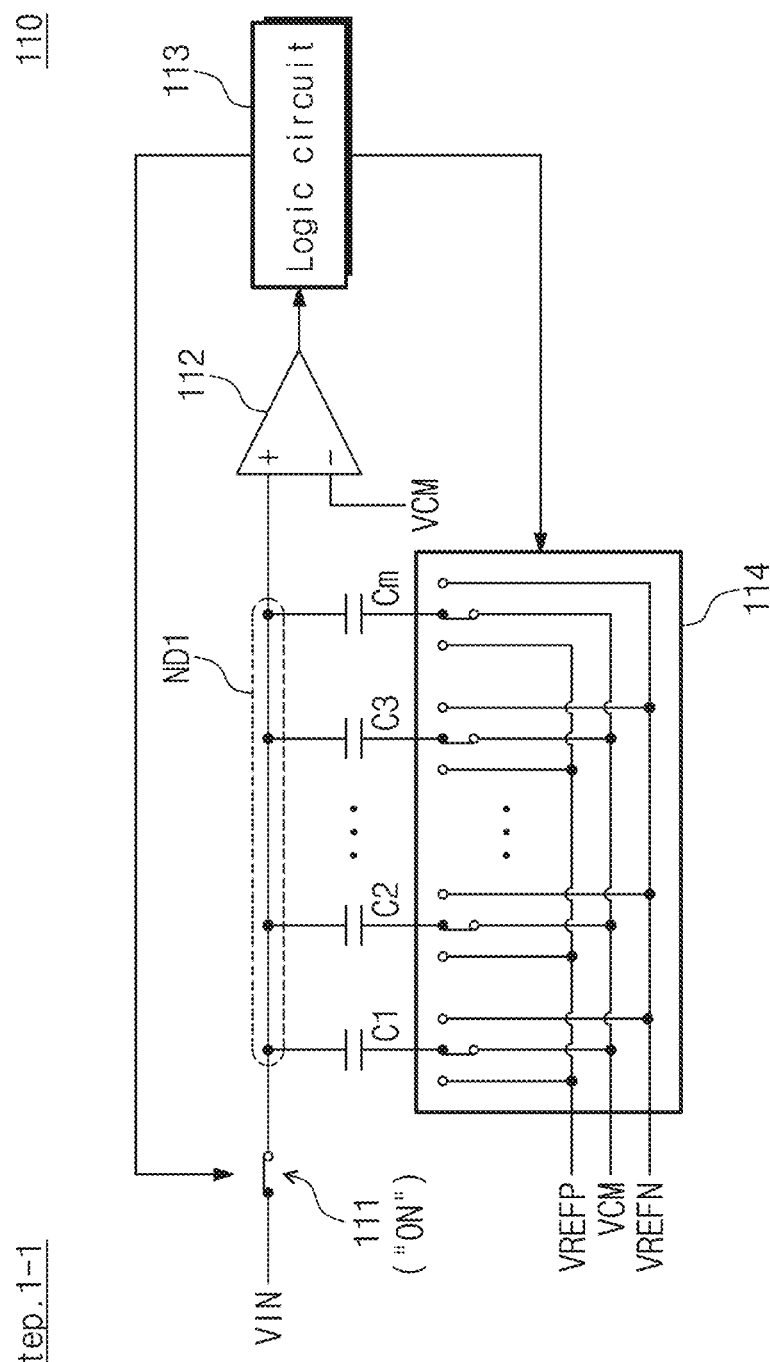
FIGS. 3 to 6 are circuit diagrams illustrating exemplary operations of a first converting circuit of FIG. 1.

FIG. 3 is a circuit diagram illustrating an exemplary operation of a first converting circuit of FIG. 2.

Referring to FIG. 3, the switching circuit 114 may include switches that are respectively connected with the capacitive elements C1 to C3 and the capacitive element Cm.

In step 1-1 of FIG. 3, the sampler 111 may perform a sampling operation. The sampler 111 may be controlled by logic circuit 113. For example, the sampler 111 may be turned on under control of the logic circuit 113. The sampler 111 may be connected between a supply terminal of the signal VIN and the node ND1. Accordingly, the signal VIN may be transferred to the node ND1 through the sampler 111.

In step 1-1 of FIG. 3, the logic circuit 113 may control the switches of the switching circuit 114 for the purpose of providing the common mode voltage VCM to the capacitive elements C1 to C3 and the capacitive element Cm. Under control of the logic circuit 113, the switches of the switching circuit 114 may connect a supply terminal of the common mode voltage VCM with each of the capacitive elements C1 to C3 and the capacitive element Cm.

As the common mode voltage VCM is provided to the capacitive elements C1 to C3 and the capacitive element Cm and a voltage sampled from the signal VIN is formed at the node ND1, the capacitive elements C1 to C3 and the capacitive element Cm may be charged by the voltage formed at the node ND1. For example, energy corresponding to the voltage of the node ND1 may be stored in the capacitive elements C1 to C3 and the capacitive element Cm. That is, the signal VIN may be sampled by the operations of the sampler 111 and the switching circuit 114.

Figure 4:
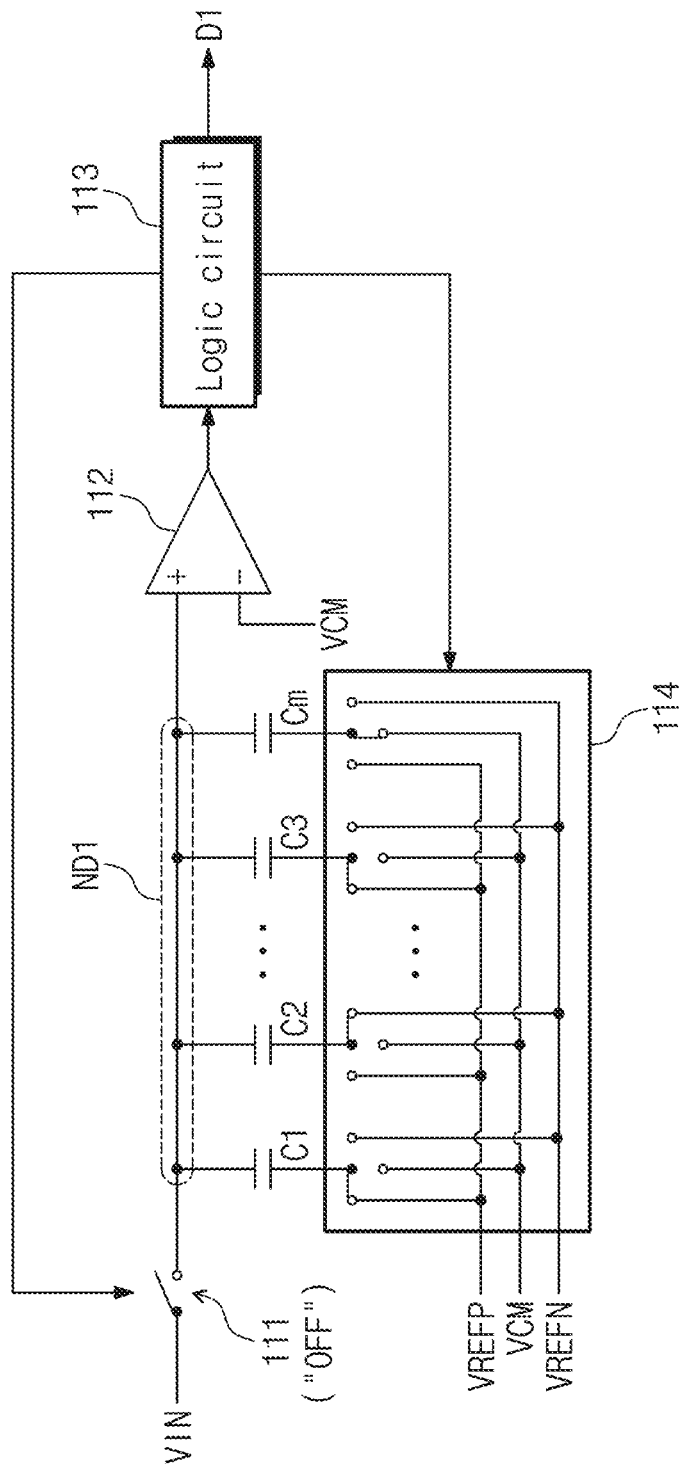

FIG. 4 is a circuit diagram illustrating an exemplary operation of a first converting circuit of FIG. 2.

In step 1-2 of FIG. 4, the logic circuit 113 may control the sampler 111. The sampler 111 may be turned off under control of the logic circuit 113. The sampler 111 may disconnect the supply terminal of the signal VIN from the node ND1.

In step 1-2 of FIG. 4, the logic circuit 113 may control the switches of the switching circuit 114 for the purpose of providing one of the reference voltages VREFP and VREFN to the capacitive elements C1 to C3 and the capacitive element Cm. Under control of the logic circuit 113, the switches of the switching circuit 114 may connect a supply terminal of the reference voltage VREFP or VREFN with each of the capacitive elements C1 to C3.

For example, operation 1-2 of FIG. 4 may be a part of operations of the SAR ADC for converting the analog signal VIN into the digital signal D1. The switches connected with the capacitive elements C1 to C3 and the capacitive element Cm may correspond to individual bits of data indicated by the digital signal D1, respectively.

In the case where the number of capacitive elements C1 to C3 is "n", element values of the capacitive elements C1 to C3 may correspond to "n" bits from a most significant bit of the data corresponding to the signal VIN. For example, a ratio between the element values of the capacitive elements C1 to C3 may be 2n:2n−1 . . . :1.

The first converting circuit 110 may further include the capacitive element Cm, in addition to the capacitive elements C1 to C3 for storing the energy corresponding to the "n" bits. An element value of the capacitive element Cm may correspond to the element value of the capacitive element C3. For example, the element value of the capacitive element Cm may be set to be substantially identical to the element value of the capacitive element C3.

The switches connected with the capacitive elements C1 to C3 may operate to store the energy of magnitudes corresponding to the bits of the digital signal D1 in the capacitive elements C1 to C3, respectively. The logic circuit 113 may control the switches based on a level of a signal formed at the node ND1 for the purpose of storing the energy in the respective capacitive elements C1 to C3.

The comparator 112 may compare the level of the signal formed at the node ND1 and the reference level of the common mode voltage VCM. The comparator 112 may provide a comparison result to the logic circuit 113. The logic circuit 113 may control the switches based on the comparison result. The logic circuit 113 may sequentially control the switches in order from the capacitive element C1 to the capacitive element C3.

When the level of the voltage formed at the node ND1 is equal to or greater than the reference level of the common mode voltage VCM, the logic circuit 113 may connect a switch with the supply terminal of the reference voltage VREFP. When the level of the voltage formed at the node ND1 is smaller than the reference level of the common mode voltage VCM, the logic circuit 113 may connect a switch with the supply terminal of the reference voltage VREFN.

In the example of FIG. 4, a value of a most significant bit of the digital signal D1 corresponding to the signal VIN is "1", the switch connected with the capacitive element C1 may be connected with the supply terminal of the reference voltage VREFP. In the example of FIG. 4, a value of a second most significant bit of the digital signal D1 corresponding to the signal VIN is "0", the switch connected with the capacitive element C2 may be connected with the supply terminal of the reference voltage VREFN. In the example of FIG. 4, a value of an n-th most significant bit of the digital signal D1 corresponding to the signal VIN is "1", the switch connected with the capacitive element C3 may be connected with the supply terminal of the reference voltage VREFP.

As the switches connected with the capacitive elements C1 to C3 are sequentially connected with the supply terminal of the reference voltage VREFP or VREFN, a level of a signal formed at the node ND1 may vary. The comparator 112 may output comparison results, which are generated by sequentially comparing levels of the signal formed at the node ND1 and the reference level of the common mode voltage VCM, to the logic circuit 113. The logic circuit 113 may collect the comparison results and may generate the digital signal D1. Through the exemplary SAR ADC operations described above, the logic circuit 113 may output the digital signal D1 indicating "n" upper bits of data corresponding to the signal VIN.

Figure 5:
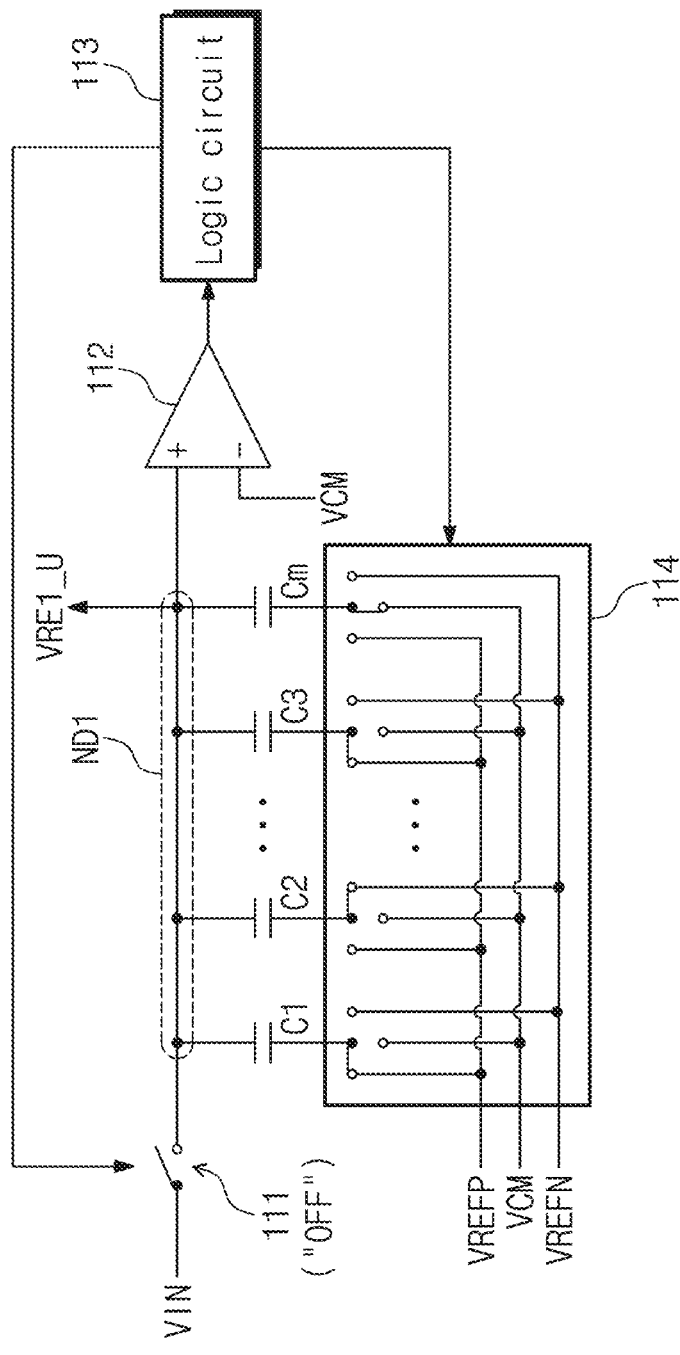

FIG. 5 is a circuit diagram illustrating an exemplary operation of a first converting circuit of FIG. 2.

After the switches connected with the capacitive elements C1 to C3 are sequentially connected with the supply terminal of the reference voltage VREFP or VREFN, in step 1-3, a voltage VRE1_U may be formed at the node ND1. The voltage VRE1_U may be a residual voltage that is generated depending on the conversion operation of the first converting circuit 110.

As the energy corresponding to the data of the digital signal D1 is stored in the capacitive elements C1 to C3, a level of the voltage VRE1_U may correspond to a data value of lower bits (e.g., (n+1)-th to LSB bits) of data to be converted from the signal VIN. The voltage VRE1_U may be output to the amplifying circuit 120 as the voltage VRE1 of FIG. 1.

Figure 6:
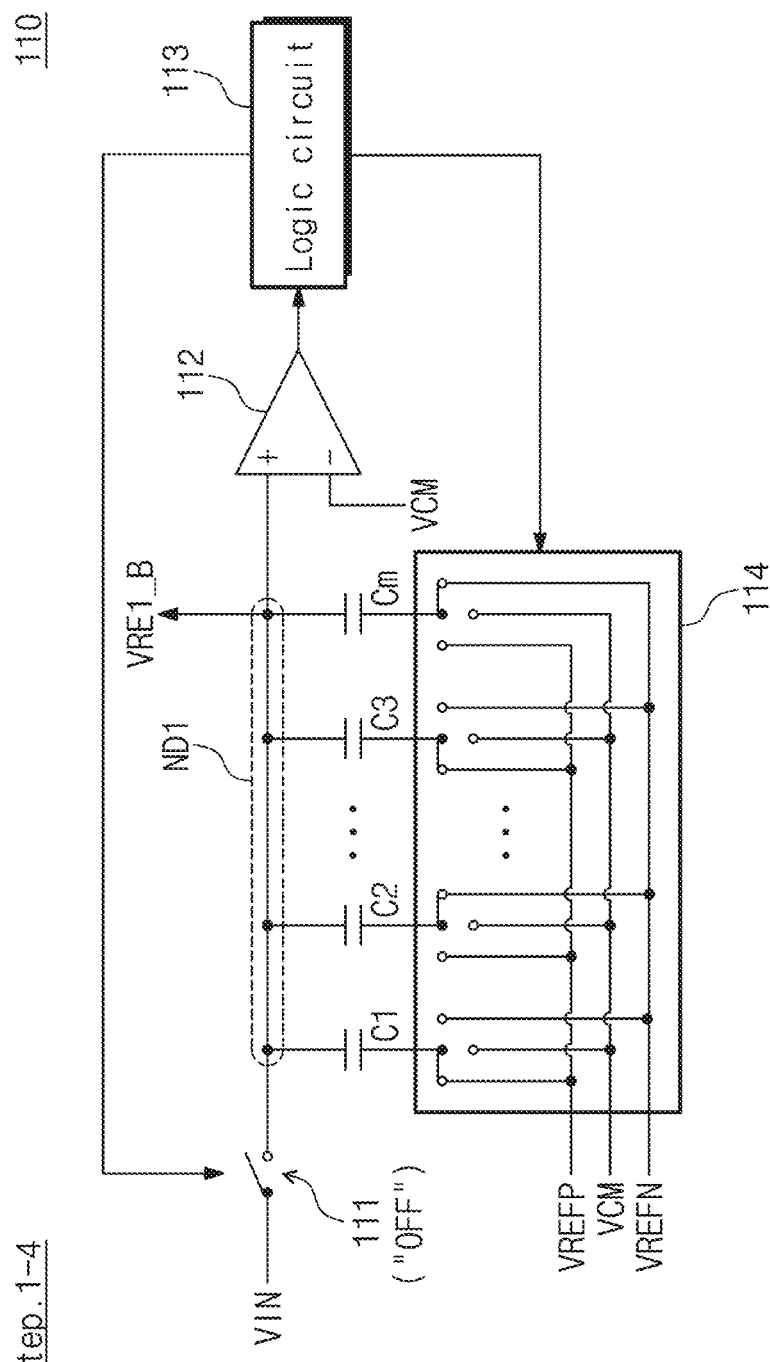

FIG. 6 is a circuit diagram illustrating an exemplary operation of a first converting circuit of FIG. 2.

In step 1-4 of FIG. 6, the logic circuit 113 may control a switch based on a level of the voltage VRE1_U formed at the node ND1. The comparator 112 may compare the level of the voltage VRE1_U and the reference level of the common mode voltage VCM. The comparator 112 may provide a comparison result to the logic circuit 113.

The logic circuit 113 may control the switch connected with the capacitive element Cm based on the comparison result. When the level of the voltage VRE1_U formed at the node ND1 is equal to or greater than the reference level of the common mode voltage VCM, the logic circuit 113 may connect the switch connected with the capacitive element Cm with the supply terminal of the reference voltage VREFP. When the level of the voltage VRE1_U formed at the node ND1 is smaller than the reference level of the common mode voltage VCM, the logic circuit 113 may connect the switch connected with the capacitive element Cm with the supply terminal of the reference voltage VREFN.

After the switch connected with the capacitive element Cm is connected with the supply terminal of the reference voltage VREFP or VREFN, a voltage VRE1_B may be formed at the node ND1. The element value of the capacitive element Cm may be set to be substantially identical to the element value of the capacitive element C3. As energy is stored in the capacitive element Cm, a level of a signal formed at the node ND1 may decrease, and thus, the voltage VRE1_B may be generated from the voltage VRE1_U. The voltage VRE1_B may be output to the amplifying circuit 120 as the voltage VRE1 of FIG. 1.

The energy stored in the capacitive element C3 and the capacitive element Cm may correspond to a least significant bit of the digital signal D1. Because the voltage VRE1_B is generated as energy is stored in the capacitive element Cm by the voltage VRE1_U, a sum of a level of the voltage VRE1_U and a level of the voltage VRE1_B may correspond to the least significant bit of the digital signal D1.

In step 1-3 and step 1-4, the signals VRE1_U and VRE1_B may be output to the amplifying circuit 120. In step 1-3 and step 1-4, the signals VRE1_U and VRE1_B may be sequentially output to the amplifying circuit 120. The signals VRE1_U and VRE1_B may be amplified through one amplifying path of the amplifying circuit 120. For example, the amplifying circuit 120 may include one amplifier configured to amplify the signals VRE1_U and VRE1_B. Because the signals VRE1_U and VRE1_B are amplified through one amplifying path, the signals VRE1_U and VRE1_B may be amplified based on substantially the same gain (e.g., "A" of FIG. 1).

In the case where the signals VRE1_U and VRE1_B are respectively amplified through different amplifying paths and a mismatch between gains of the amplifying paths occurs, gain calibration of the signals VRE1_U and VRE1_B may be required. Because the amplifying circuit 120 amplifies the signals VRE1_U and VRE1_B through one amplifying path, additional electronic circuits for performing gain calibration on the signals VRE1_U and VRE1_B are not required in designing the electronic circuit 100. Because the electronic circuit 100 does not include additional circuits for gain calibration, the electronic circuit 100 may be designed to consume less power and to be disposed in a smaller area.

Figure 7:
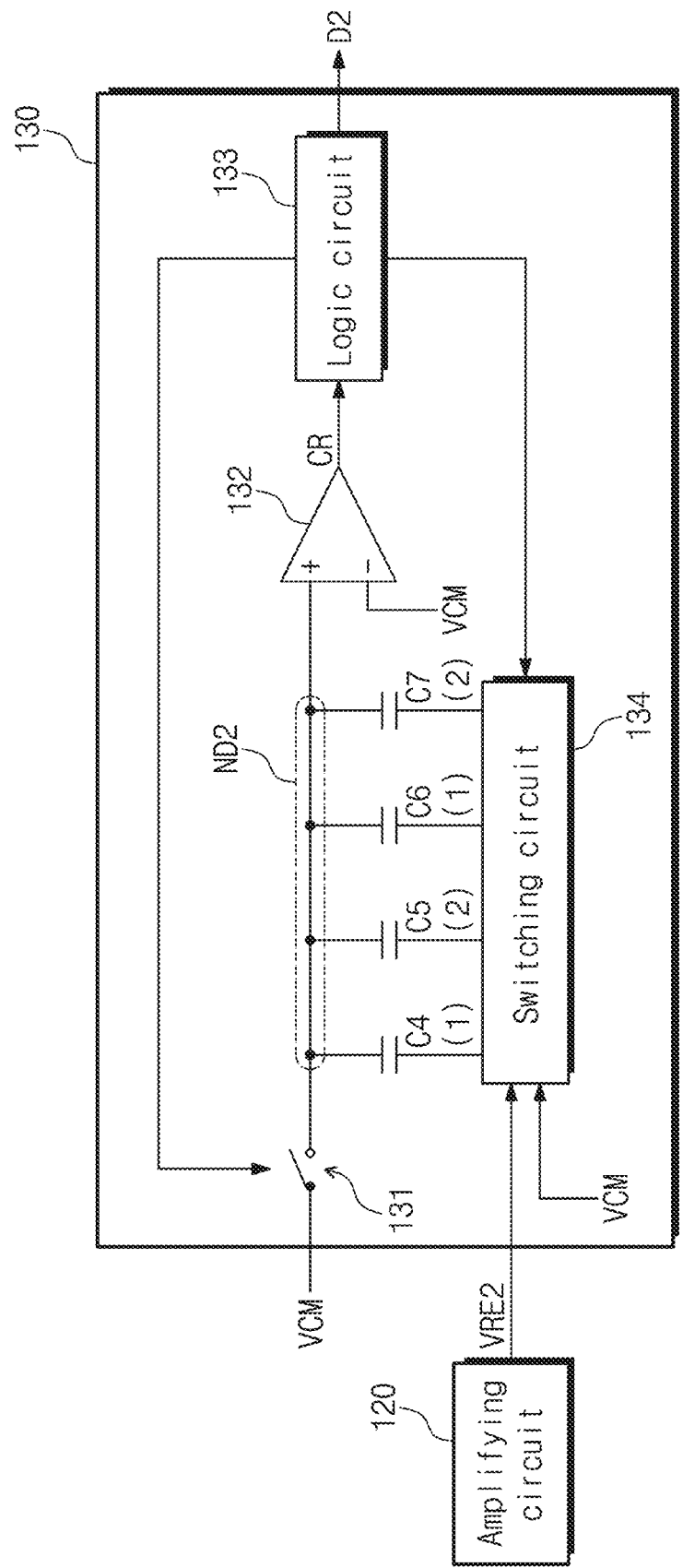
FIG. 7 is a block diagram illustrating an exemplary configuration of a second converting circuit of FIG. 1.

FIG. 7 is a block diagram illustrating an exemplary configuration of a second converting circuit of FIG. 1.

Referring to FIG. 7, the second converting circuit 130 may include a sampler 131, a comparator 132, a logic circuit 133, a switching circuit 134, and capacitive elements C4 to C7. An example is illustrated in FIG. 7 as the second converting circuit 130 of FIG. 1 includes four capacitive elements C4 to C7, but the number of capacitive elements included in the second converting circuit 130 may be variously determined depending on a resolution selected by a designer.

The sampler 131 may receive the common mode voltage VCM. For example, the sampler 131 may receive the common mode voltage VCM from an electronic device such as an external voltage generator. The sampler 131 may operate under control of the logic circuit 133. For example, the sampler 131 may connect the supply terminal of the signal VIN and a node ND2 under control of the logic circuit 133. Alternatively, the sampler 131 may disconnect the supply terminal of the common mode voltage VCM from the node ND2 under control of the logic circuit 133.

The comparator 132 may receive a voltage formed at the node ND2 through a non-inverting terminal and may receive the common mode voltage VCM through an inverting terminal. The comparator 132 may compare a level of the voltage formed at the node ND2 and the reference level of the common mode voltage VCM. The comparator 132 may generate a comparison result corresponding to the comparison operation. The comparator 132 may output a signal indicating the comparison result to the logic circuit 133.

When a level of a voltage (i.e., the voltage of the node ND2) received through the non-inverting terminal is equal to or greater than a level of a voltage (i.e., the reference level of the common mode voltage VCM) received through the inverting terminal, the comparator 132 may output the signal indicating a logical value of "1" as the comparison result. In contrast, when the level of the voltage (i.e., the voltage of the node ND2) received through the non-inverting terminal is smaller than the level of the voltage (i.e., the reference level of the common mode voltage VCM) received through the inverting terminal, the comparator 132 may output the signal indicating a logical value of "0" as the comparison result.

The logic circuit 133 may sequentially obtain comparison results based on a signal CR received from the comparator 132. The logic circuit 133 may control the switching circuit 134 based on the sequentially obtained comparison results. For example, the logic circuit 133 may control the switching circuit 134 depending on logic for implementing various types of interpolation operations.

Depending on an operation of the switching circuit 134 that is performed under control of the logic circuit 133, the capacitive elements C4 to C7 may be charged by a voltage formed at the node ND2. Exemplary control operations in which the logic circuit 133 controls the switching circuit 134 will be more fully described with reference to FIGS. 8 to 11.

The logic circuit 133 may collect comparison results that are obtained based on the signal CR received from the comparator 132 and may obtain digital data converted from the voltage VRE2 based on the collected comparison results. The logic circuit 133 may generate the digital signal D2 indicating the obtained digital data. The logic circuit 133 may output the digital signal D2 to the error correction circuit 140 of FIG. 1.

The switching circuit 134 may receive the common mode voltage VCM from an electronic device such as a voltage generator. The switching circuit 134 may receive the voltage VRE2 from the amplifying circuit 120. As described with reference to FIG. 1, the voltage VRE2 may be generated by the amplifying circuit 120 based on the voltage VRE1.

The amplifying circuit 120 may amplify the voltage VRE1_U to generate a voltage VRE2_U and may amplify the voltage VRE1_B to generate a voltage VRE2_B. Accordingly, an example is illustrated in FIG. 7 as the voltage VRE2 is one voltage, but it may be well understood that the voltage VRE2 include the signals VRE2_U and VRE2_B that are sequentially generated over time.

For example, a ratio between an element value of the capacitive element C4 and an element value of the capacitive element C5 may be 1:2, and a ratio between an element value of the capacitive element C6 and an element value of the capacitive element C7 may be 1:2. The capacitive elements C4 and C5 may be used to sample the voltage VRE2_U. The capacitive elements C6 and C7 may be used to sample the voltage VRE2_B.

The switching circuit 134 may operate under control of the logic circuit 133. Under control of the logic circuit 133, the switching circuit 134 may selectively provide one of the voltage VRE2 or the common mode voltage VCM to each of the capacitive elements C4 to C7. Exemplary operations of the switching circuit 134 that are performed under control of the logic circuit 133 will be more fully described with reference to FIGS. 8 to 11.

An accurate operation may be required to perform an interpolation operation based on residual voltages. Accordingly, an electronic circuit for performing an interpolation operation may be complicatedly designed in general. However, the second converting circuit 130 of FIG. 7 may have relatively low complexity (i.e., may be composed of the relatively small number of elements). Accordingly, the electronic circuit 100 may be designed to consume less power and to be disposed in a smaller area.

Figure 8:
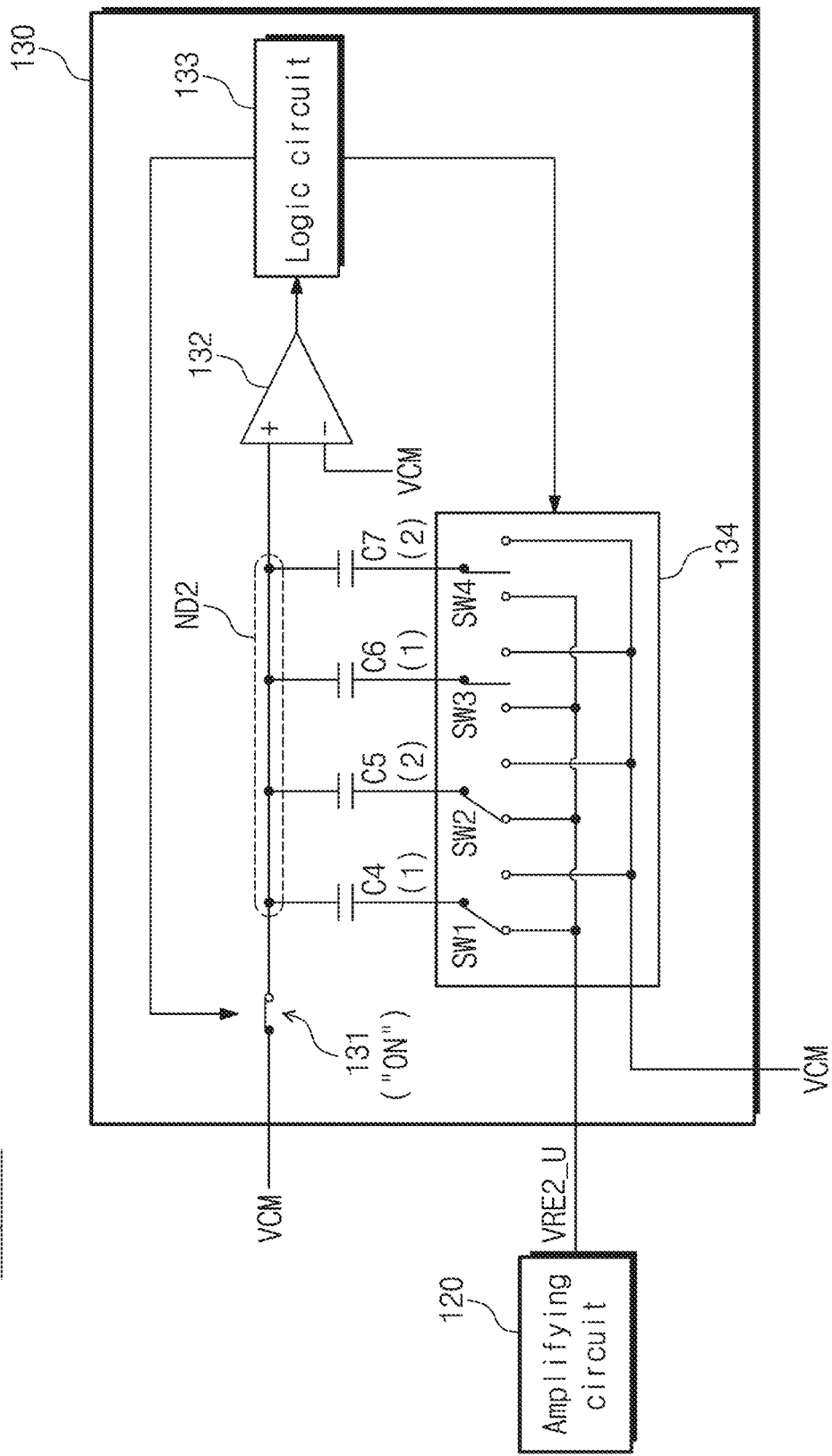
FIGS. 8 to 11 are block diagrams illustrating exemplary operations of a second converting circuit of FIG. 7.

FIG. 8 is a circuit diagram illustrating an exemplary operation of a second converting circuit of FIG. 7.

Referring to FIG. 8, the switching circuit 134 may include switches SW1 to SW4. The switching circuit 134 may receive the voltage VRE2_U from the amplifying circuit 120. The switching circuit 134 may receive the common mode voltage VCM.

In step 2-1 of FIG. 8, the voltage VRE2_U may be sampled by the second converting circuit 130. In the example of FIG. 8, the sampler 131 may be turned on. The supply terminal of the common mode voltage VCM and the node ND2 may be connected by the sampler 131. The common mode voltage VCM may be transferred to the node ND2 through the sampler 131.

The switching circuit 134 may receive the voltage VRE2_U from the amplifying circuit 120. To sample the voltage VRE2_U, the switches SW1 and SW2 may be connected with the amplifying circuit 120. The switches SW3 and SW4 may be disconnected from the amplifying circuit 120 and may be in a floating state. The voltage VRE2_U may be transferred to the capacitive elements C4 and C5 through the switches SW1 and SW2. The capacitive elements C4 and C5 may store energy corresponding to the voltage VRE2_U.

Figure 9:
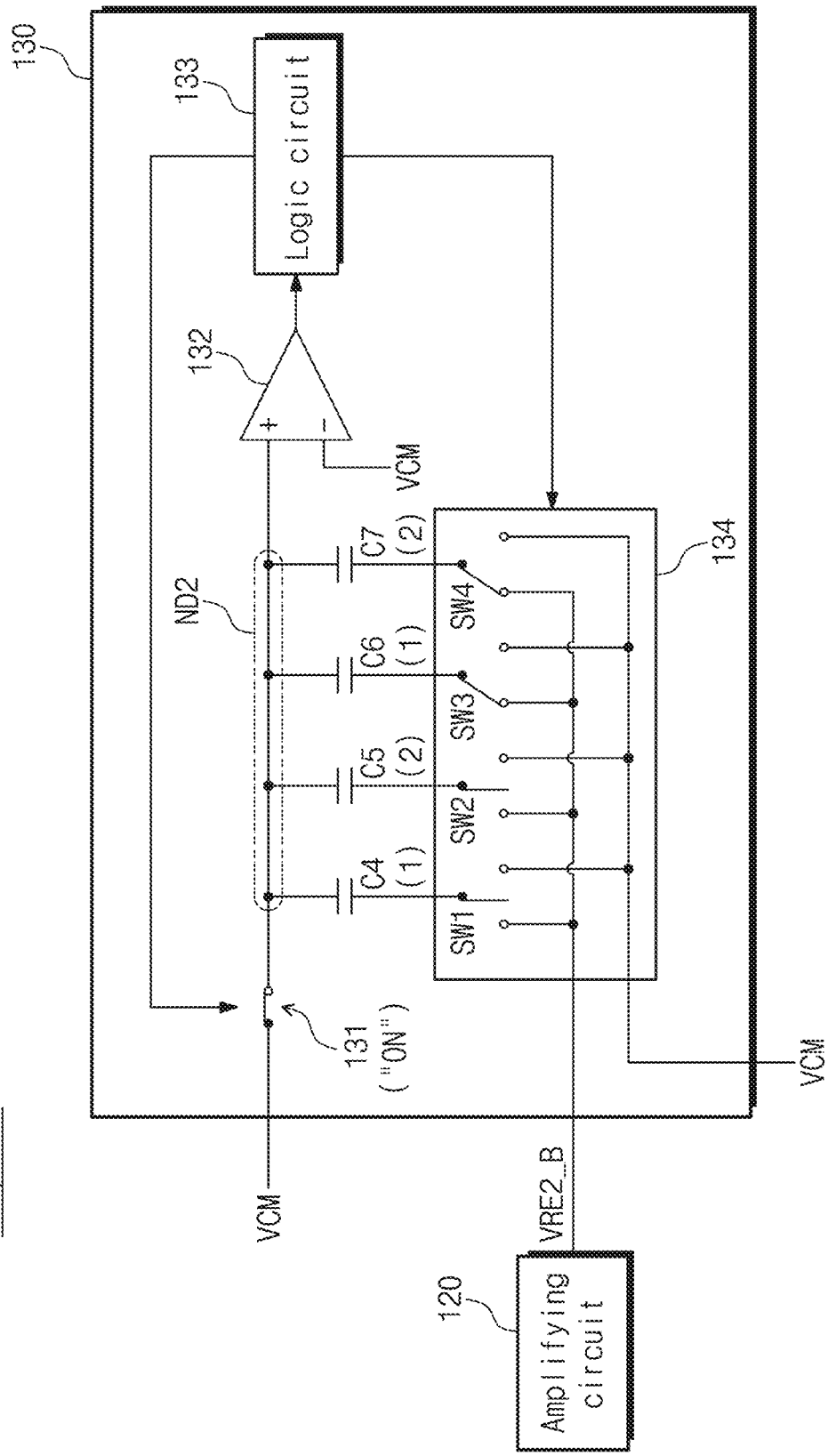

FIG. 9 is a circuit diagram illustrating an exemplary operation of a second converting circuit of FIG. 7.

In step 2-2 of FIG. 9, the voltage VRE2_B may be sampled by the second converting circuit 130. In the example of FIG. 9, the switching circuit 134 may receive the voltage VRE2_B from the amplifying circuit 120. To sample the voltage VRE2_B, the switches SW3 and SW4 may be connected with the amplifying circuit 120. The switches SW1 and SW2 may be disconnected from the amplifying circuit 120 and may be in a floating state. The voltage VRE2_B may be transferred to the capacitive elements C6 and C7 through the switches SW3 and SW4. The capacitive elements C6 and C7 may store energy corresponding to the voltage VRE2_B.

Figure 10:
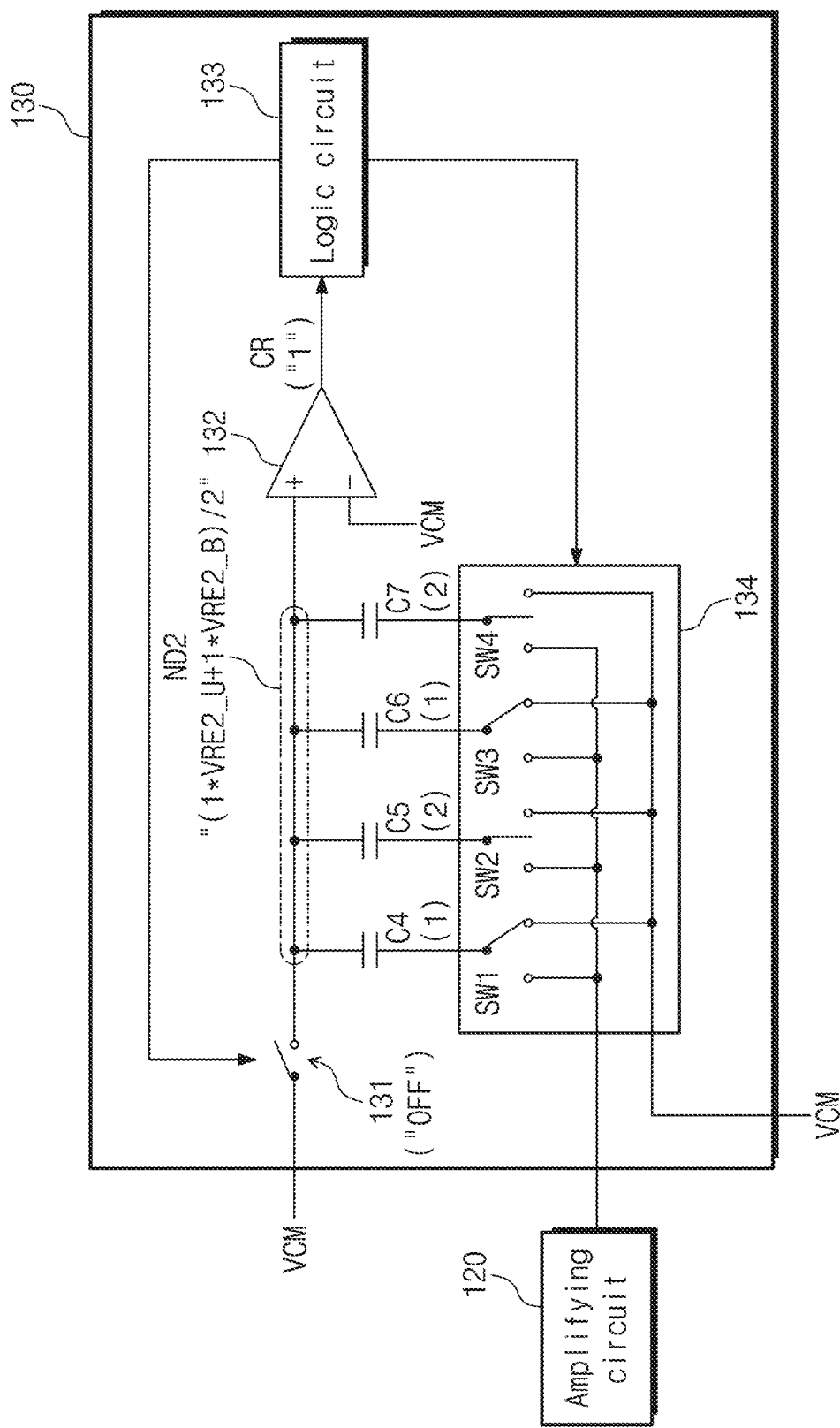

FIG. 10 is a circuit diagram illustrating an exemplary operation of a second converting circuit of FIG. 7.

In step 2-3 of FIG. 10 and step 2-4 to be described with reference to FIG. 11, the logic circuit 133 may perform an interpolation operation based on the sampled signals VRE2_U and VRE2_B. For example, the logic circuit 133 may convert the voltage VRE2 into the digital signal D2 based on an interpolation operation according to binary search logic.

In step 2-3, the logic circuit 133 may perform an operation for comparing an intermediate value of levels of the voltages VRE2_U and VRE2_B and the reference level of the common mode voltage VCM depending on the binary search logic. Accordingly, the logic circuit 133 may control the switching circuit 134 such that a voltage having a level of "(1*VRE2_U+1*VRE2_B)/2" is formed at the node ND2. The switches SW1 and SW3 may be connected with the supply terminal of the common mode voltage VCM under control of the logic circuit 133.

As described with reference to step 2-1 of FIG. 8 and step 2-2 of FIG. 9, the energy corresponding to the voltage VRE2_U may be stored in the capacitive element C4, and the energy corresponding to the voltage VRE2_B may be stored in the capacitive element C6. A ratio between an element value of the capacitive element C4 and an element value of the capacitive element C6 may be 1:1. Accordingly, a level of a voltage formed at the node ND2 in step 2-3 may be "(1*VRE2_U+1*VRE2_B)/2".

The comparator 132 may compare "(1*VRE2_U+1*VRE2_B)/2" being the level of the voltage formed at the node ND2 and the reference level of the common mode voltage VCM. In the example of FIG. 10, "(1*VRE2_U+1*VRE2_B)/2" may be greater than "VCM". Accordingly, the comparator 132 may output the signal CR indicating a logical value of "1" to the logic circuit 133. The logic circuit 133 may obtain the logical value of "1" as a data value corresponding to the voltage VRE2 based on the signal CR.

Figure 11:
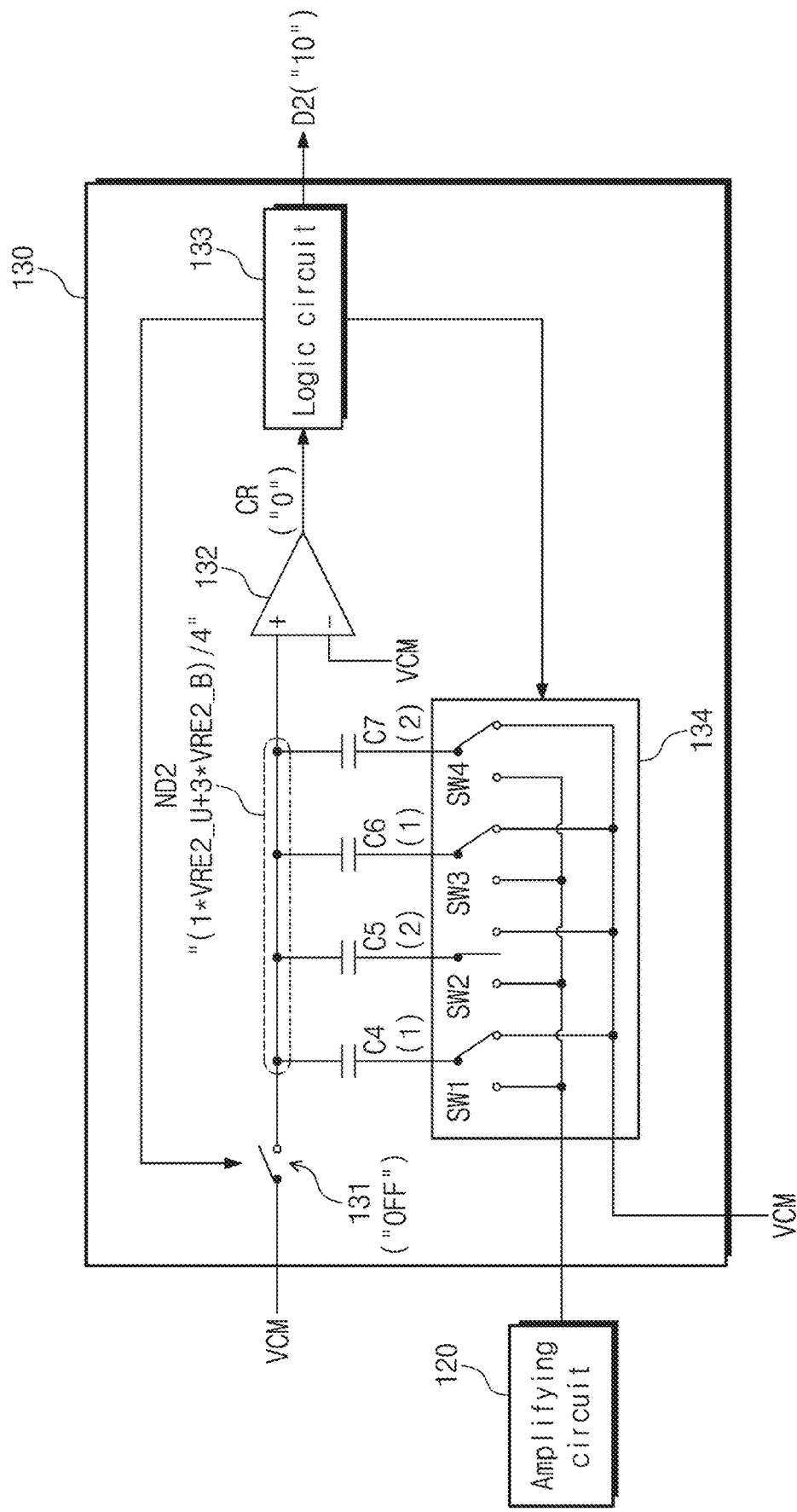

FIG. 11 is a circuit diagram illustrating an exemplary operation of a second converting circuit of FIG. 7.

Because it is determined in step 2-3 that "(1*VRE2_U+1*VRE2_B)/2" is greater than "VCM", in step 2-4 of FIG. 11, the logic circuit 133 may perform an operation of comparing an intermediate value of levels of the voltage VRE2_B and the voltage of "(1*VRE2_U+1*VRE2_B)/2" and the reference level of the common mode voltage VCM depending on the binary search logic.

Accordingly, the logic circuit 133 may control the switching circuit 134 such that a voltage of "(1*VRE2_U+3*VRE2_B)/4" being the intermediate value of "(1*VRE2_U+1*VRE2_B)/2" and "VRE2_B" is formed at the node ND2. The switches SW1, SW3, and SW4 may be connected with the supply terminal of the common mode voltage VCM under control of the logic circuit 133. The switches SW1, SW3, and SW4 may be connected with the supply terminal of the common mode voltage VCM.

As described with reference to step 2-1 of FIG. 8 and step 2-2 of FIG. 9, the energy corresponding to the voltage VRE2_U may be stored in the capacitive element C4, and the energy corresponding to the voltage VRE2_B may be stored in the capacitive elements C6 and C7. A ratio between an element value of the capacitive element C4 and a sum of element values of the capacitive elements C6 and C7 may be 1:3. Accordingly, a level of a voltage formed at the node ND2 in step 2-4 may be "(1*VRE2_U+3*VRE2_B)/4".

The comparator 132 may compare "(1*VRE2_U+3*VRE2_B)/4" being the level of the voltage formed at the node ND2 and the reference level of the common mode voltage VCM. In the example of FIG. 10, "(1*VRE2_U+3*VRE2_B)/4" may be smaller than "VCM". Accordingly, the comparator 132 may output the signal CR indicating a logical value of "0" to the logic circuit 133. The logic circuit 133 may obtain the logical value of "0" as a data value corresponding to the voltage VRE2 based on the signal CR.

The logic circuit 133 may generate the digital signal D2 based on the logical value of "1" obtained in step 2-3 and the logical value of "0" obtained in step 2-4. For example, the digital signal D2 may indicate data "10". The logic circuit 133 may output the digital signal D2 to the error correction circuit 140 of FIG. 1. That is, the second converting circuit 130 may generate a 2nd least significant bit of data corresponding to the signal VIN through step 2-3 of FIG. 10 and may generate a least significant bit of the data corresponding to the signal VIN through step 2-4 of FIG. 11.

Figure 12:
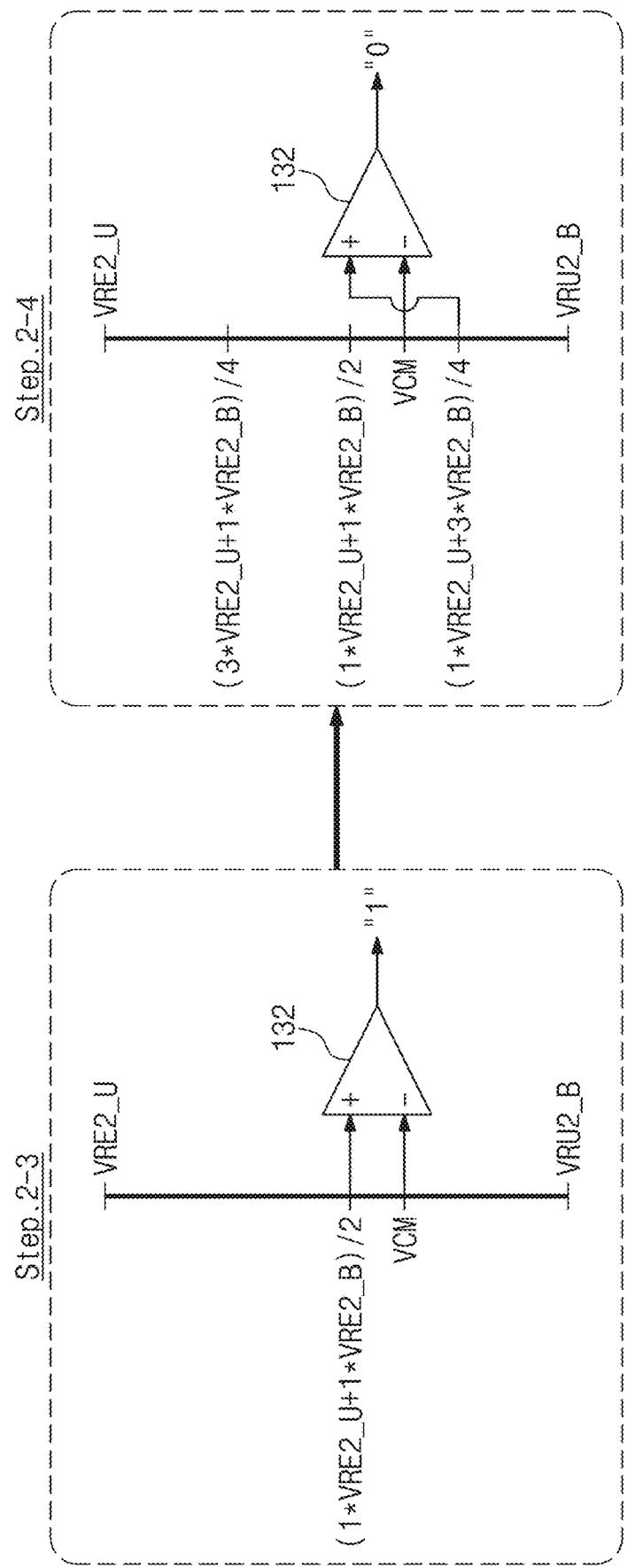
FIG. 12 is a conceptual diagram for describing an exemplary operation of a comparator described with reference to FIGS. 10 and 11.

FIG. 12 is a conceptual diagram for describing an exemplary operation of a comparator described with reference to FIGS. 10 and 11.

As described with reference to FIGS. 10 and 11, the second converting circuit 130 may convert the voltage VRE2 into the digital signal D2 based on the binary search logic.

In step 2-3, the comparator 132 may receive a voltage of "(1*VRE2_U+1*VRE2_B)/2" through the non-inverting terminal and may receive the common mode voltage VCM through the inverting terminal. Because "(1*VRE2_U+1*VRE2_B)/2" is greater than "VCM", the comparator 132 may output a logical value of "1".

As described with reference to FIG. 11, after step 2-3, the logic circuit 133 may control the switching circuit 134 in response to the logical value of "1" such that the voltage of "(1*VRE2_U+3*VRE2_B)/4" is received through the non-inverting terminal of the comparator 132. In step 2-4, the comparator 132 may receive the voltage of "(1*VRE2_U+3*VRE2_B)/4" through the non-inverting terminal and may receive the common mode voltage VCM through the inverting terminal. Because "(1*VRE2_U+3*VRE2_B)/4" is smaller than "VCM", the comparator 132 may output a logical value of "0".

An embodiment in which "(1*VRE2_U+1*VRE2_B)/2" is greater than "VCM" is described with reference to FIGS. 8 to 12, but it may be understood that in the case where "(1*VRE2_U+1*VRE2_B)/2" is smaller than "VCM", there is performed step 2-4 in which the voltage of "(3*VRE2_U+1*VRE2_B)/4" is formed at the node ND2 under control of the logic circuit 133 and the comparator 132 compares "(3*VRE2_U+1*VRE2_B)/4" and "VCM" to generate the signal CR having a specific logical value.

Figure 13:
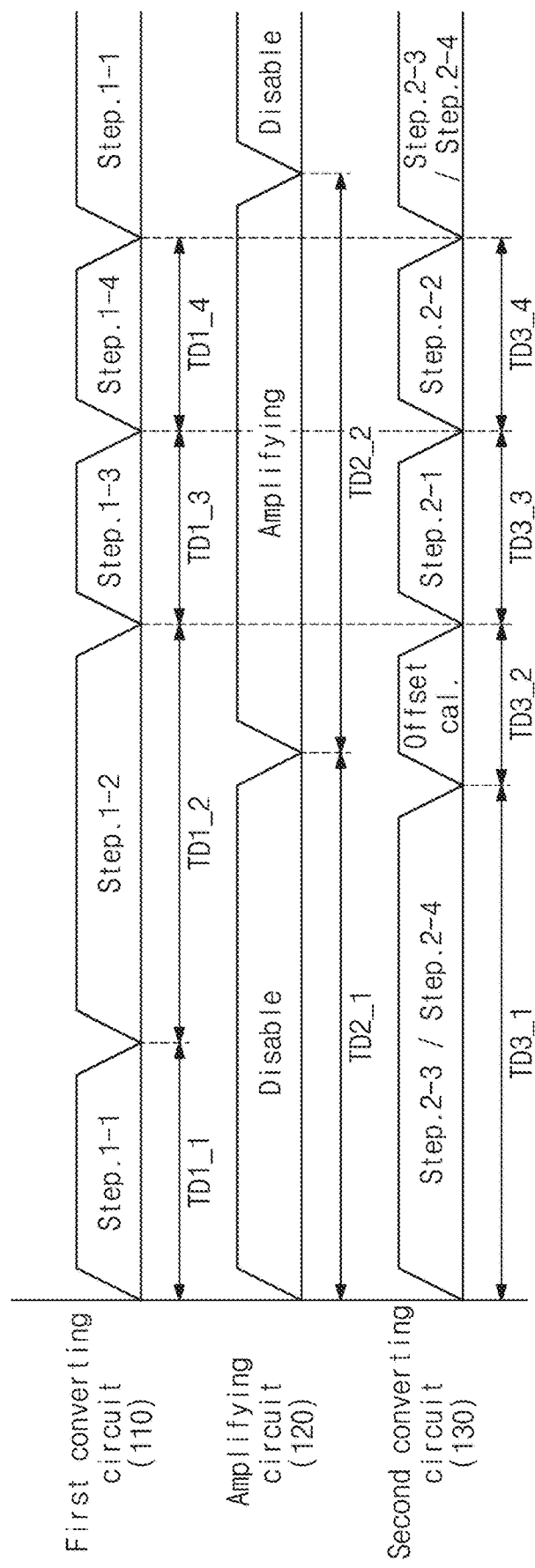
FIG. 13 is a timing diagram illustrating an operation of an electronic circuit of FIG. 1.

FIG. 13 is a timing diagram illustrating an operation of an electronic circuit of FIG. 1.

In time duration TD1_1, the first converting circuit 110 may perform step 1-1. In detail, the first converting circuit 110 may sample the signal VIN received from the outside of the electronic circuit 100.

In time duration TD1_2, the first converting circuit 110 may perform step 1-2. As described with reference to FIG. 3, in the time duration TD1_2, the first converting circuit 110 may convert the signal VIN and may generate the digital signal D1. The digital signal D1 may indicate upper bits of digital data corresponding to the signal VIN. That is, in the time duration TD1_1, the first converting circuit 110 may perform coarse conversion on the signal VIN.

In time duration TD1_3, the first converting circuit 110 may perform step 1-3. In detail, the first converting circuit 110 may output the voltage VRE1_U formed at the node ND1 by the coarse conversion operation to the amplifying circuit 120.

In time duration TD1_4, the first converting circuit 110 may perform step 1-4. In detail, energy may be stored in the capacitive element Cm by the operation of the switch connected with the capacitive element Cm. As the energy is stored in the capacitive element Cm, the voltage VRE1_B may be formed at the node ND1. The first converting circuit 110 may output the voltage VRE1_B to the amplifying circuit 120. After the time duration TD1_4, the first converting circuit 110 may periodically and repeatedly perform the operations that are performed during the time duration TD1_1 to the time duration TD1_4.

In time duration TD2_1, the amplifying circuit 120 may not operate. In time duration TD2_2, the amplifying circuit 120 may sequentially receive the signals VRE1_U and VRE1_B from the first converting circuit 110. The amplifying circuit 120 may amplify the sequentially received signals VRE1_U and VRE1_B and may generate the signals VRE2_U and VRE2_B. The amplifying circuit 120 may output the signals VRE2_U and VRE2_B to the second converting circuit 130.

The amplifying circuit 120 may be designed to operate during time duration TD2_2 including time duration TD1_3 and time duration TD1_4. Accordingly, the sequentially received signals VRE1_U and VRE1_B may be amplified by the amplifying circuit 120. After the time duration TD2_2, the amplifying circuit 120 may periodically and repeatedly perform the operations that are performed during the time duration TD2_1 and the time duration TD2_2.

In time duration TD3_1, the amplifying circuit 120 may perform step 2-3 and step 2-4. As described with reference to FIGS. 10 and 11, in the time duration TD3_1, the second converting circuit 130 may convert the voltage VRE2 generated based on the signal VIN (e.g., generated by amplifying the voltage VRE1 generated as a result of performing the coarse conversion operation on the signal VIN) and may generate the digital signal D2. The digital signal D2 may indicate lower bits of the digital data corresponding to the signal VIN. That is, in the time duration TD3_1, the second converting circuit 130 may perform an interpolation operation on the voltage VRE1.

In time duration TD3_2, the logic circuit 133 of the second converting circuit 130 may calculate a level of an offset signal generated by the comparator 132. Afterwards, the logic circuit 133 may operate in consideration of the level of the offset signal generated by the comparator 132. Accordingly, the accuracy of operation of the logic circuit 133 may be improved.

In time duration TD3_3, the second converting circuit 130 may perform step 2-1. In detail, in step 2-1, the second converting circuit 130 may sample the voltage VRE2_U received from the amplifying circuit 120. In time duration TD3_4, step 2-2 may be performed. In detail, in step 2-2, the second converting circuit 130 may sample the voltage VRE2_B received from the amplifying circuit 120. After the time duration TD3_4, the second converting circuit 130 may periodically and repeatedly perform the operations that are performed during the time duration TD3_1 to the time duration TD3_4.

An example is illustrated in FIG. 13 as the time duration TD1_3 is substantially identical to the time duration TD3_3 and the time duration TD1_4 is substantially identical to the time duration TD3_4. However, it may be understood that the second converting circuit 130 may perform step 2-1 and step 2-2 during any time duration for receiving the signals VRE2_U and VRE2_B generated based on the signals VRE1_U and VRE1_B.

For example, the second converting circuit 130 may be configured to perform step 2-1 during the time duration TD3_3 included in the time duration TD1_3 and to perform step 2-2 during the time duration TD3_4 included in the time duration TD1_4.

Figure 14:
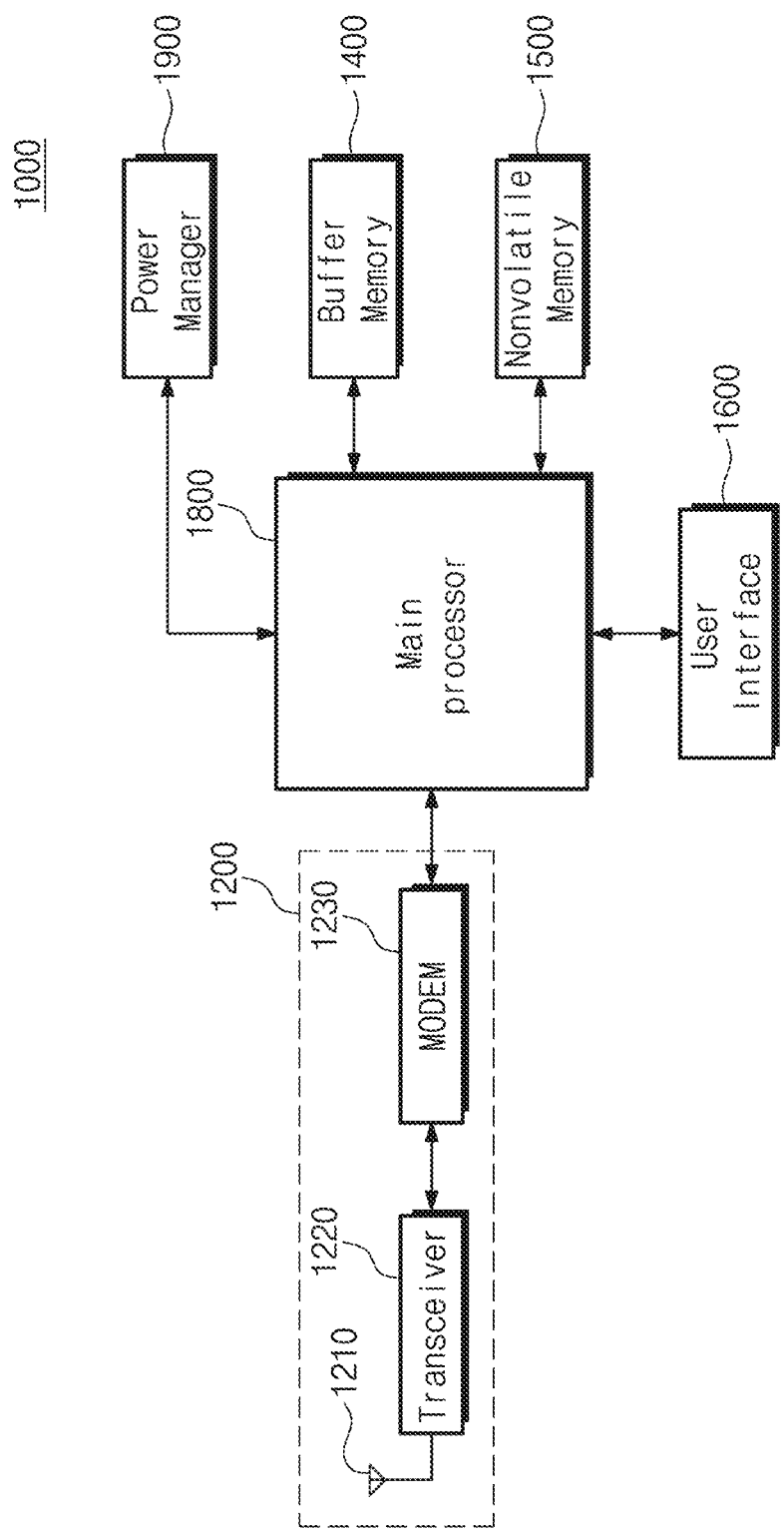
FIG. 14 is a block diagram illustrating an exemplary electronic device including an electronic circuit of FIG. 1.

FIG. 14 is a block diagram illustrating an exemplary electronic device including an electronic circuit of FIG. 1.

An electronic device 1000 may include a communication block 1200, a buffer memory 1400, a nonvolatile memory 1500, a user interface 1600, a main processor 1800, and a power manager 1900. However, components of the electronic device 1000 are not limited to the embodiment of FIG. 14. The electronic device 1000 may not include one or more of the components illustrated in FIG. 14 or may further include at least one component not illustrated in FIG. 14.

The communication block 1200 may include an antenna 1210, a transceiver 1220, and a modulator/demodulator (MODEM) 1230. The communication block 1200 may exchange signals with an external device/system through the antenna 1210. The MODEM 1230 may include an electronic circuit for converting an analog signal received through the antenna 1210 to a digital signal. For example, the transceiver 1220 may include the electronic circuit 100 of FIG. 1.

For example, the transceiver 1220 and the MODEM 1230 of the communication block 1200 may process signals, which are exchanged with the external device/system, in compliance with a wireless communication protocol such as long term evolution (LTE), worldwide interoperability for microwave access (WiMax), global system for mobile communication (GSM), code division multiple access (CDMA), Bluetooth, near field communication (NFC), wireless fidelity (Wi-Fi), or radio frequency identification (RFID).

The buffer memory 1400 may store data that are used for an operation of the electronic device 1000. For example, the buffer memory 1400 may temporarily store data processed or to be processed by the main processor 1800. For example, the buffer memory 1400 may include a volatile memory, such as a static random access memory (SRAM), a dynamic RAM (DRAM), or a synchronous DRAM (SDRAM), and/or a nonvolatile memory, such as a flash memory, a phase-change RAM (PRAM), a magneto-resistive RAM (MRAM), a resistive RAM (ReRAM), or a ferro-electric RAM (FRAM).

The nonvolatile memory 1500 may store data regardless of whether a power is supplied. For example, the nonvolatile memory 1500 may include at least one of various nonvolatile memories such as a flash memory, a PRAM, an MRAM, a ReRAM, and a FRAM. For example, the nonvolatile memory 1500 may include a removable memory such as a hard disk drive (HDD), a solid state drive (SSD), or a secure digital (SD) card, and/or an embedded memory such as an embedded multimedia card (eMMC).

The user interface 1600 may arbitrate communication between a user and the electronic device 1000. For example, the user may input a command to the electronic device 1000 through the user interface 1600. The user interface 1600 may include a sensor (e.g., a touch sensor and a motion sensor) for sensing an action (e.g., a touch and a movement) of the user. The sensor may generate analog signals based on the sensed action of the user.

The user interface 1600 may include an electronic circuit for converting the analog signals generated by the sensor. For example, the user interface 1600 may include the electronic circuit 100 of FIG. 1. For example, the electronic device 1000 may provide information generated by the main processor 1800 to the user through the user interface 1600.

The main processor 1800 may control overall operations of the electronic device 1000. The main processor 1800 may control/manage operations of the components of the electronic device 1000. The main processor 1800 may process various operations for the purpose of operating the electronic device 1000.

For example, the main processor 1800 may process various operations based on digital signals converted by the electronic circuit 100 included in the communication block 1200, the user interface 1600, etc. For example, the main processor 1800 may be implemented with a general-purpose processor, a special-purpose processor, or an application processor.

The power manager 1900 may power the components of the electronic device 1000. For example, the power manager 1900 may appropriately convert a power received from a battery and/or an external power source and may provide the converted power to the components of the electronic device 1000.

According to an embodiment of the present disclosure, an electronic circuit including converting circuits that consume less power and are disposed in a smaller area may be provided.

While the present disclosure has been described with reference to exemplary embodiments thereof, it will be apparent to those of ordinary skill in the art that various changes and modifications may be made thereto without departing from the spirit and scope of the present disclosure as set forth in the following claims.

What is claimed is:

1. An electronic circuit comprising:
a first converting circuit configured to output a first residual voltage associated with converting an analog signal into a first digital signal and to output a second residual voltage generated based on the first residual voltage;
an amplifying circuit configured to generate a third residual voltage by amplifying the first residual voltage through an amplifying path during a first time duration and to generate a fourth residual voltage by amplifying the second residual voltage through the amplifying path during a second time duration after the first time duration; and
a second converting circuit configured to generate a second digital signal associated with the analog signal by performing an interpolation operation based on the third residual voltage and the fourth residual voltage.

2. The electronic circuit of claim 1, wherein the second residual voltage is generated as energy stored in a first capacitive element varies based on the first residual voltage.

3. The electronic circuit of claim 1, wherein the first residual voltage is generated as energy stored in a second capacitive element varies based on the analog signal.

4. The electronic circuit of claim 1, wherein the second converting circuit is further configured to:
store energy in second capacitive elements based on the third residual voltage and store energy in third capacitive elements based on the fourth residual voltage.

5. The electronic circuit of claim 1, wherein the second converting circuit is further configured to:
compare target levels of a voltage generated based on the third residual voltage and the fourth residual voltage with a reference level.

6. The electronic circuit of claim 5, wherein the second digital signal indicates data obtained by collecting comparison results of comparing the target levels and the reference level.

7. The electronic circuit of claim 1, further comprising:
an error correction circuit configured to generate a third digital signal corresponding to the analog signal, based on the first digital signal and the second digital signal.

8. The electronic circuit of claim 7, wherein the error correction circuit is further configured to:
correct the second digital signal based on the first digital signal.

9. An electronic circuit comprising:
a first converting circuit configured to output a first residual voltage associated with converting an analog signal into a first digital signal and to output a second residual voltage generated as energy stored in a first capacitive element varies based on the first residual voltage; and
a second converting circuit configured to perform an interpolation operation based on a third residual voltage and a fourth residual voltage and to output a second digital signal associated with the analog signal,
wherein the third residual voltage and the fourth residual voltage are obtained by respectively amplifying the first residual voltage and the second residual voltage through one amplifying path.

10. The electronic circuit of claim 9, wherein a magnitude of the first residual voltage is associated with a data value of the second digital signal, and a sum of the magnitude of the first residual voltage and a magnitude of the second residual voltage is associated with a least significant bit of the first digital signal.

11. The electronic circuit of claim 9, wherein the first residual voltage is generated as energy stored in a second capacitive element varies based on the analog signal.

12. The electronic circuit of claim 11, wherein a magnitude of the energy stored in the first capacitive element is determined based on comparison between a level of a voltage generated based on the energy stored in the second capacitive element and a reference level.

13. The electronic circuit of claim 9, wherein the first converting circuit is further configured to:
output the first residual voltage during a first time duration and output the second residual voltage during a second time duration after the first time duration.

14. The electronic circuit of claim 9, wherein the interpolation operation includes an operation associated with binary search logic.

15. An electronic circuit comprising:
a first converting circuit configured to output a first residual voltage generated as an analog signal is converted into first bits of a first digital signal and a second residual voltage generated based on the first residual voltage;
an amplifying circuit configured to generate a third residual voltage by amplifying the first residual voltage through an amplifying path and to generate a fourth residual voltage by amplifying the second residual voltage through the amplifying path; and
a second converting circuit configured to generate second bits of the first digital signal, based on energy stored in first capacitive elements based on the third residual voltage and energy stored in second capacitive elements based on the fourth residual voltage.

16. The electronic circuit of claim 15, wherein the second converting circuit is further configured to:
generate a second digital signal based on comparison between a first target level of a target voltage generated based on the energy stored in the first capacitive element and the energy stored in the second capacitive element and a reference level.

17. The electronic circuit of claim 16, wherein the second converting circuit is further configured to:
generate the second digital signal further based on comparison between a second target level of the target voltage and the reference level, when the first target level is smaller than the reference level, and
wherein the second target level is smaller than the first target level.

18. The electronic circuit of claim 17, wherein the second converting circuit is further configured to:
generate the second digital signal further based on comparison between a third target level of the target voltage and the reference level, when the first target level is greater than the reference level, and
wherein the third target level is greater than the first target level.

19. The electronic circuit of claim 18, wherein the first target level, the second target level, and the third target level are determined based on binary search logic.

20. The electronic circuit of claim 15, wherein a ratio between element values of the first capacitive elements and element values of the second capacitive elements are determined based on binary search logic.

* * * * *